United States Patent [19]
Tanaka et al.

[11] Patent Number: 5,111,323
[45] Date of Patent: May 5, 1992

[54] OPTICAL SWITCHING SYSTEM

[75] Inventors: Toshiki Tanaka, Ome; Katsuyuki Imoto, Sayama; Hiroshi Kuwahara; Taihei Suzuki, both of Kodaira, all of Japan

[73] Assignee: Hitachi, Ltd., Tokyo, Japan

[21] Appl. No.: 358,514

[22] Filed: May 30, 1989

Related U.S. Application Data

[63] Continuation of Ser. No. 15,379, Feb. 17, 1987, abandoned.

[30] Foreign Application Priority Data

Mar. 7, 1986 [JP] Japan .................................. 61-48254

[51] Int. Cl.$^5$ ............................................. H04J 14/08
[52] U.S. Cl. ..................................... 359/139; 359/117
[58] Field of Search ...................... 370/1, 4; 350/96.13, 350/96.14; 455/617; 359/117, 139

[56] References Cited

U.S. PATENT DOCUMENTS 4,397,016 8/1983 Broussaud ................................ 370/4
4,608,682 8/1986 Nagashima et al. ............. 350/96.14

OTHER PUBLICATIONS

Callahan; "Optical Delay Line Compressor;" *IBM Technical Disclosure Bulletin;* vol. 14; No. 8; Dec. 1971; pp. 2208-2209.

Thewalt; "Time Domion Multiplexing of Signals on an Optical Fiber Line Using Mode Locked Laser Pulses;" *IBM Technical Disclosure Bulletin;* vol. 24; No. 5; Oct. 1981.

N.E.C. Research and Development, Special Issue, 1985, pp. 254-263, Tokyo, Jp. H. Goto "Office communication technologies" p. 257 para 3.1; p. 258, FIG. 4.

Sixth Topical Meeting on Optical Fiber Communication, New Orleans Feb. 28-Mar. 2, 1983, pp. 22-23, H. Goto, et al. "Optical time-division digital switching: and experiment" Whole article.

IEEE Communications Magagine, Vo. 24, no. 5, May 1986, pp. 50-55, IEEE, New York, U.S.; S. P. Sue, et al.: "A review on classification of optical switching systems"; p. 50, right-hand column, line 39-p. 51 right--hand column, line 41.

Patent Abstracts of Japan, vol. 11, No. 341 (E-554) [2788], Nov. 7, 1987; and JP-A-62 120 797 (Hitachi, Ltd.) Feb. 6, 1987 Abstract.

*Primary Examiner*—Edward L. Coles, Sr.
*Assistant Examiner*—L. Pascal
*Attorney, Agent, or Firm*—Antonelli, Terry, Stout & Kraus

[57] ABSTRACT

When the subscribers are connected with the switching system by the optical fibers, in order to realize the signal exchange without converting the optical signals sent by the optical fibers into the electric signal, the optical switching system is constituted by: an optical time division multiplexer for time division multiplexing the optical signals which were sent by a plurality of fiber optic cables corresponding to a plurality of subscribers; an optical time switch for changing the time arrangement of the output signals of the optical time division multiplexer; and an optical time division demultiplexer for distributing the time sequential signal of the output signals of the optical time switch to the optical fibers of a plurality of subscriber lines.

9 Claims, 9 Drawing Sheets

OPTICAL SWITCHING SYSTEM

This application is a continuation of application Ser. No. 015,379, abandoned filed Feb. 17, 1987.

BACKGROUND OF THE INVENTION

The present invention relates to an optical switching system and, more particularly, to an optical switching system for connecting a plurality of subscribers or terminal equipment with each other by optical signals. In more detail, the invention relates to an optical switching system in which the subscribers or terminal equipment are connected with the optical switching system by use of fiber optic cables and the signal exchange in the switching unit is performed without converting the signal into the electric signal.

In association with the spread of the signal transmission using optical fibers, the optical communication network system including the signal exchange has been examined. In particular, it is presumed that the application of the optical technology to the local switch and toll switch as the central node of the services to the subscribers will give a large impact toward the future era of digital integration of the network system. As a final format, the realization of the optical switching system for directly switching the optical signals from the fiber optic cable is demanded. The study of such an optical switching system has just been started but several ideas have been reported.

However, in the conventional optical switching systems proposed, electric signals are used in the multiplexer and demultiplexer for coupling the lines of a plurality of subscribers with the optical switching system. Namely, the communication between a plurality of subscriber lines and the multiplexer or demultiplexer is performed by the electric signals.

Since the signal paths in the switching system are constituted as the opto-electric hybrid system, this constitution obstructs the realization of the ultra high speed, broad band, and ultra multi-channel transmission. In addition, the opto-electric hybrid system causes such a problem that the maintenance and handling are difficult.

On the other hand, no consideration is paid to the signal exchange of high speed and broad band information and the signal paths in the switching system are constituted as the opto-electric hybrid system. Thus, the realization of the ultra high speed, broad band, and ultra multi-channel transmission is obstructed. There is such a problem that the maintenace and handling are difficult.

SUMMARY OF THE INVENTION

It is an object of the present invention to provide novel time division optical switching method and apparatus in which all of the time division multiplex and demultiplex switches are executed using the optical signals and the signal path can be thoroughly realized by optical technique.

To accomplish the above object, according to the present invention, the subscribers or terminal equipment are connected with the optical switching system by a plurality of optical lines such as optical fibers or the like and the optical switching system comprises: an optical time division multiplexer for optically time division multiplexing a plurality of optical signals transmitted from the optical lines; an optical time switch for time division switching the optical signal of each line which is sent from the optical time division multiplexer; and an optical demultiplexer for demultiplexing the optical signals from the optical time switch every line and for outputting the demultiplexed optical signals to a plurality of optical lines, respectively.

The optical multiplexing function and the optical time switching function may be also realized by an integrated constitution.

With this constitution of the optical switching system, for example, the optical signal from each subscriber is transmitted through each fiber optic cable and sent to the optical time division multiplexer in the optical switching system, while the output optical signal of the optical demultiplexer in the optical switching system is transmitted to the opto-electric transducer of the subscriber through each of the other fiber optic cables. Therefore, in the optical switching system, all of the time division multiplex, demultiplex, and switching are performed by the optical signals and the signal path can be thoroughly realized by optical technique.

The above-mentioned and other features and objects of this invention will become more apparent by reference to the following description taken in conjunction with the following drawings.

DESCRIPTION OF THE PREFERRED EMBODIMENTS

Figure 1:
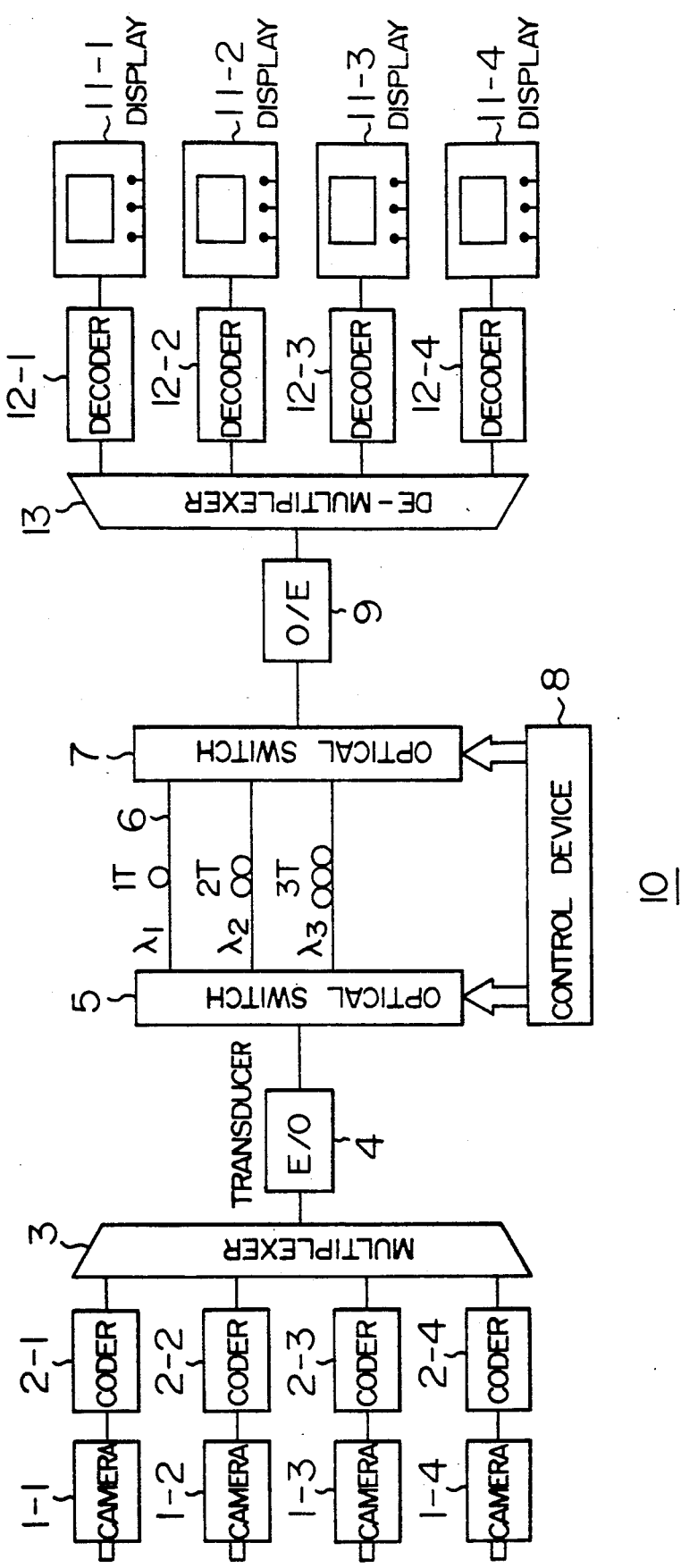
FIGS. 1 and 2 are block diagrams showing constitutions of optical switching systems which have conventionally been proposed.
Figure 2:
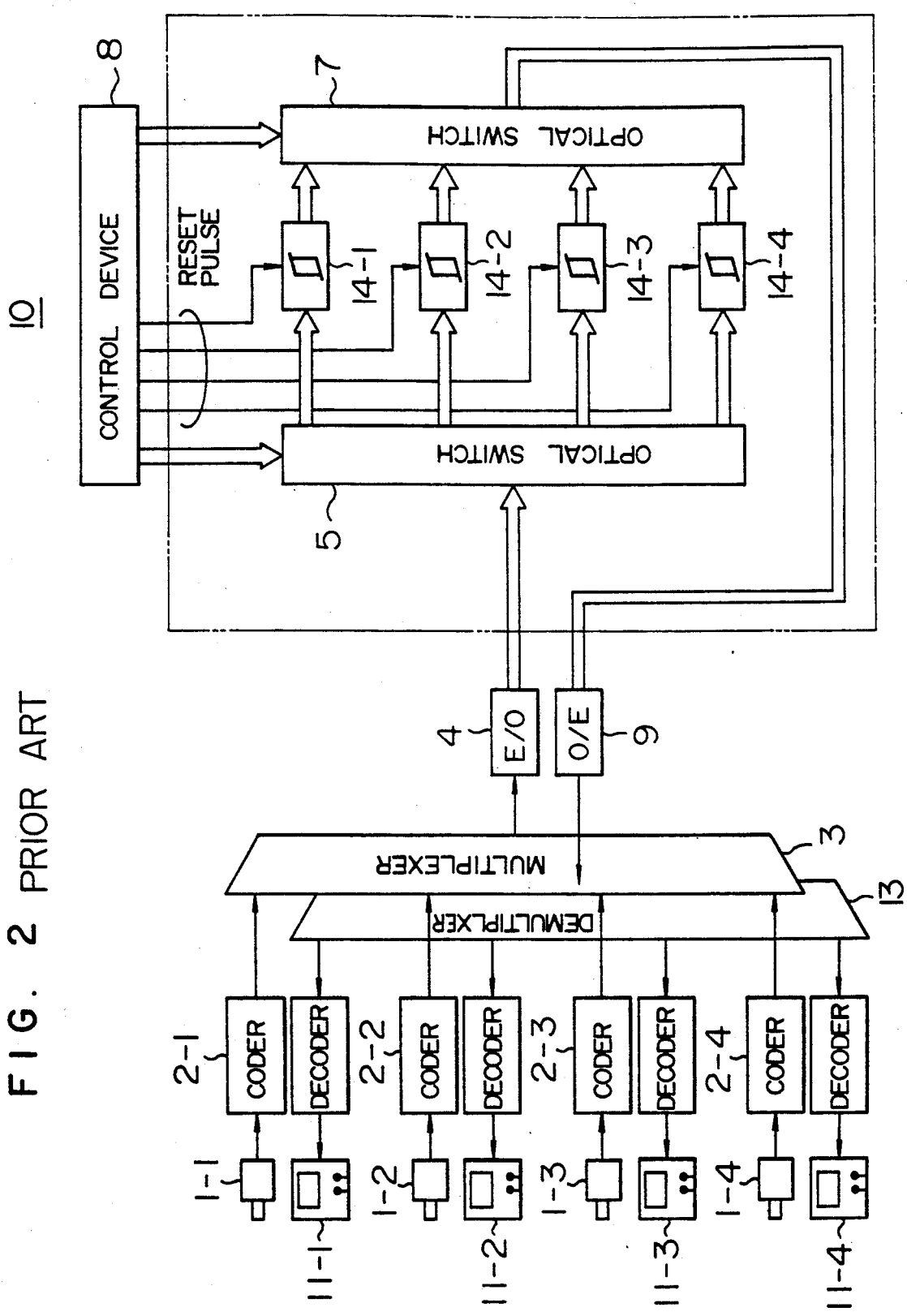

Constitutions of optical switching systems which have conventionally been proposed will be described in order to clarify the feature of the present invention. FIGS. 1 and 2 are block diagrams showing the constitutions of the optical switching systems which have conventionally been proposed. In the optical switching system in FIG. 1, the video signals from video cameras 1-1 to 1-4 of the subscribers are coded by coders 2-1 to 2-4 and electrically time division multiplexed by a multiplexer 3.

The time division multiplexed signal is then converted into the optical signal by an electro-optic transducer 4. The optical signal is sent to fiber-optic delay lines 6 having different lengths in a first optical switch 5 which constitutes an optical time switch 10 every time slot. After the optical signal was delayed by a predetermined time by each optical fiber, it is read out by a second optical switch 7. The reading order of the optical signals by the second optical switch 7 changes depending on which optical signal was sent to which one of the fiber optic delay lines 6 by the first optical switch 5. Therefore, the time division switching of the optical signals is realized. Namely, the fiber optic delay line 6 functions as the optical memory. Thereafter, the optical signal is again converted into the electric signal by an opto-electric transducer 9 and demultiplexed into each electric signal by a demultiplexer 13.

On the other hand, as shown in FIG. 2, another optical switching system which has conventionally been proposed uses bistable semiconductor laser devices 14-1 to 14-4 in place of the fiber optic delay line 6. The bistable semiconductor laser device has such a memory function that it enters the oscillating state adapted to generate a large output by a very weak incident light. The presence or absence of the optical signal divided every time slot by the writing optical switch 5 is stored as the form of the presence or absence of the laser oscillation of each of the bistable semiconductor laser devices 14-1 to 14-4. The time division switching can be performed by reading out the memory states by the reading optical switch 7 in accordance with a desired order. The other parts and components have substantially the same constitutions and functions as those designated by the same reference numerals in FIG. 1; therefore, their descriptions are omitted.

According to the conventional optical switching systems mentioned above, since the multiplexer 3 and demultiplexer 13 are electrically constituted, the subscriber circuit in the switching system is constituted as the opto-electric hybrid system. Thus, such a constitution obstructs the realization of the ultra high speed and broad band transmission and also makes it difficult to perform the maintenance and handling.

Figure 3:
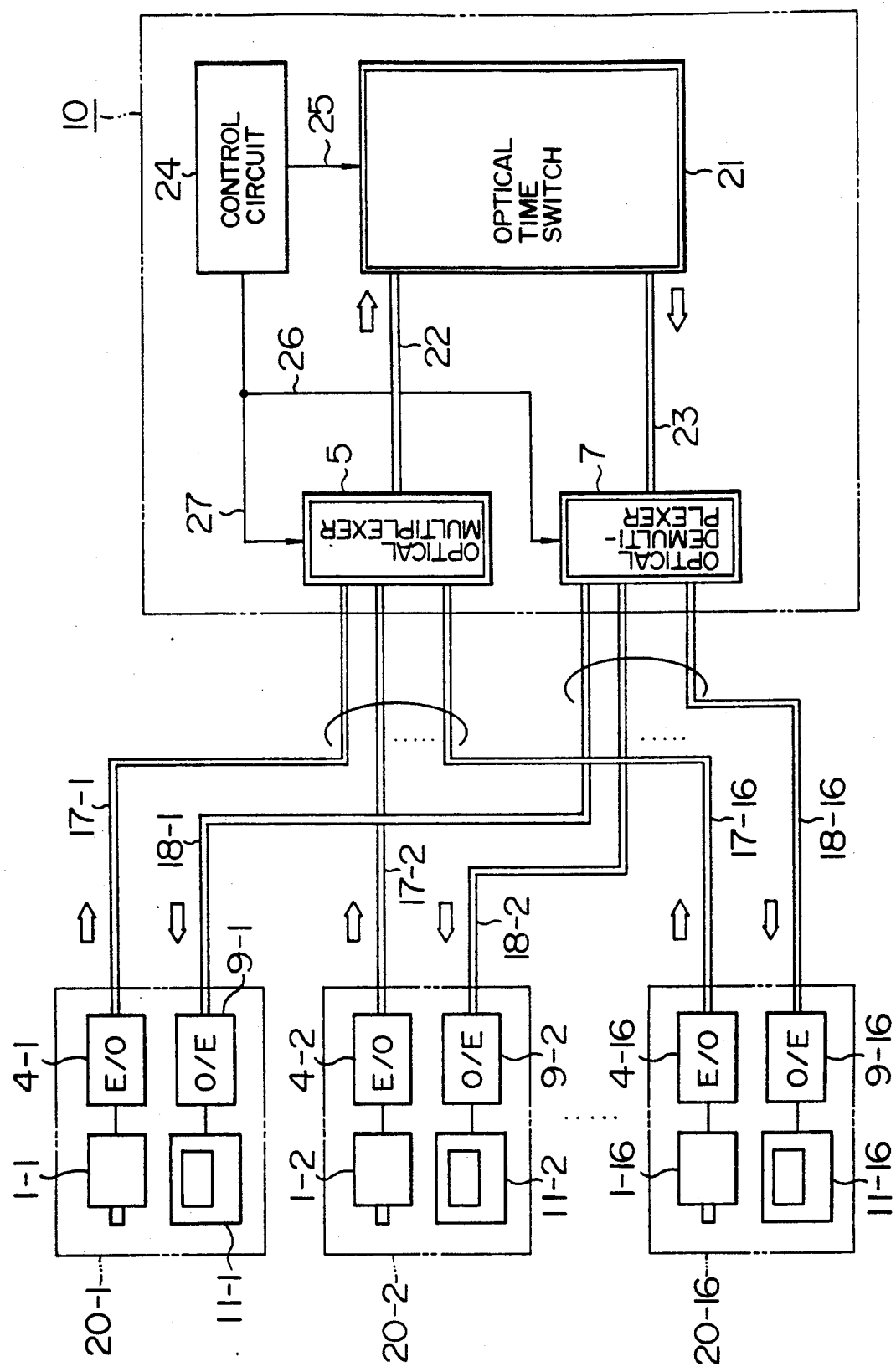
FIGS. 3 and 4 are block diagrams showing constitutions of embodiments of optical switching systems according to the present invention.

FIG. 3 is a diagram showing a constitution of an embodiment of an optical switching system according to the present invention. This embodiment relates to the optical switching system between the subscribers and the local switch for use in the video-phone system which includes the televisions at the terminals of the subscribers. The case where there are sixteen subscribers will be explained for simplicity of explanation.

As shown in FIG. 3, the subscriber terminals have: camera apparatuses 1-1 to 1-16; electro-optic transducers 4-1 to 4-16 for converting the video signal as the electric signals from the camera apparatuses into the optical signals and for sending the optical signals to fiber optic cables 17-1 to 17-16 for transmission; opto-electric transducers 9-1 to 9-16 for converting the optical signals from fiber optic cables 18-1 to 18-16 for reception into the electric signals; and display apparatuses 11-1 to 11-16 for displaying the video images of the electric signals from those opto-electric transducers. The subscriber terminals and the optical switching system 10 are connected by the cables 17 (17-1 to 17-16) for transmission and the cables 18 (18-1 to 18-16) for reception.

The optical switching system 10 includes: the optical multiplexer 5; an optical time switch 21; the optical demultiplexer 7; and an electronic control circuit 24 to exchange the time slots.

The optical multiplexer 5 time division multiplexes the optical signals which were transmitted in parallel through the fiber optic cables 17-1 to 17-16 and transmits the multiplexed optical signal to the optical time switch 21 through a fiber optic cable 22. In the optical time division multiplexed optical signal which was sent on every line is sequentially stored into the optical memory. When the optical signals stored in the optical memory are read out, their reading orders are replaced in such a manner that they are arranged at desired time positions, thereby executing the time division switching. The rearranged optical signal string is sent to the optical demultiplexer 7 and demultiplexed on every line. The demultiplexed optical signals are transmitted through the fiber optic cables 18-1 to 18-16 to the respective subscribers on the signal transmission side as indicated by arrows. These optical signals are converted into the electric signals by the opto-electric transducers 9-1 to 9-16 and displayed by the display apparatuses 11-1 to 11-16. The signal from the control circuit 24 is sent to the optical multiplexer 5, optical time switch 21, and optical demultiplexer 7 through line paths 27, 25, and 26, thereby synchronizing the optical signal of the fiber optic cable 22 with the optical signal of the fiber optic cable 23 (namely, the bit synchronization and the frame synchronization are accomplished). On the other hand, a communication control signal and a switching control signal are sent from the subscriber side. These control signals are transmitted by the wavelength multiplexing method or the method whereby they are sent before the optical signal is transmitted or the like. The control signals are received by the side of the switching system and the communication and signal exchange are controlled. Although the control system is not shown in the diagram for simplicity of explanation, it is obviously included in this embodiment.

According to this embodiment, the subscriber side 20 (20-1, 20-2, . . . , 20-16) is constituted by the terminals 1 (1-1, 1-2, . . . , 1-16) and 11 (11-1, 11-2, . . . , 11-16) electro-optic transducer 4 (4-1, 4-2, . . . , 4-16), and opto-electric transducer 9 (9-1, 9-2, . . . , 9-16). The subscriber side 20 (20-1, 20-2, . . . , 20-16) is connected with the optical switching system 10 by two fiber optic cables 17 (17-1, 17-2, . . . , 17-16) and 18 (18-1, 18-2, . . . , 18-16). Therefore, the constitution is simple. There is no need to use the electric multiplexer and demultiplexer which were used in the conventional techniques. In addition, according to the invention, all of the functions of the multiplex, demultiplex, and time switch are performed by use of the optical signals, so that the high speed and broad band signals can be handled. Further, by executing all of the signal processes by the optical technique, the S/N ratio can be remarkably improved and the reduction in size and cost can be also realized.

Figure 4:
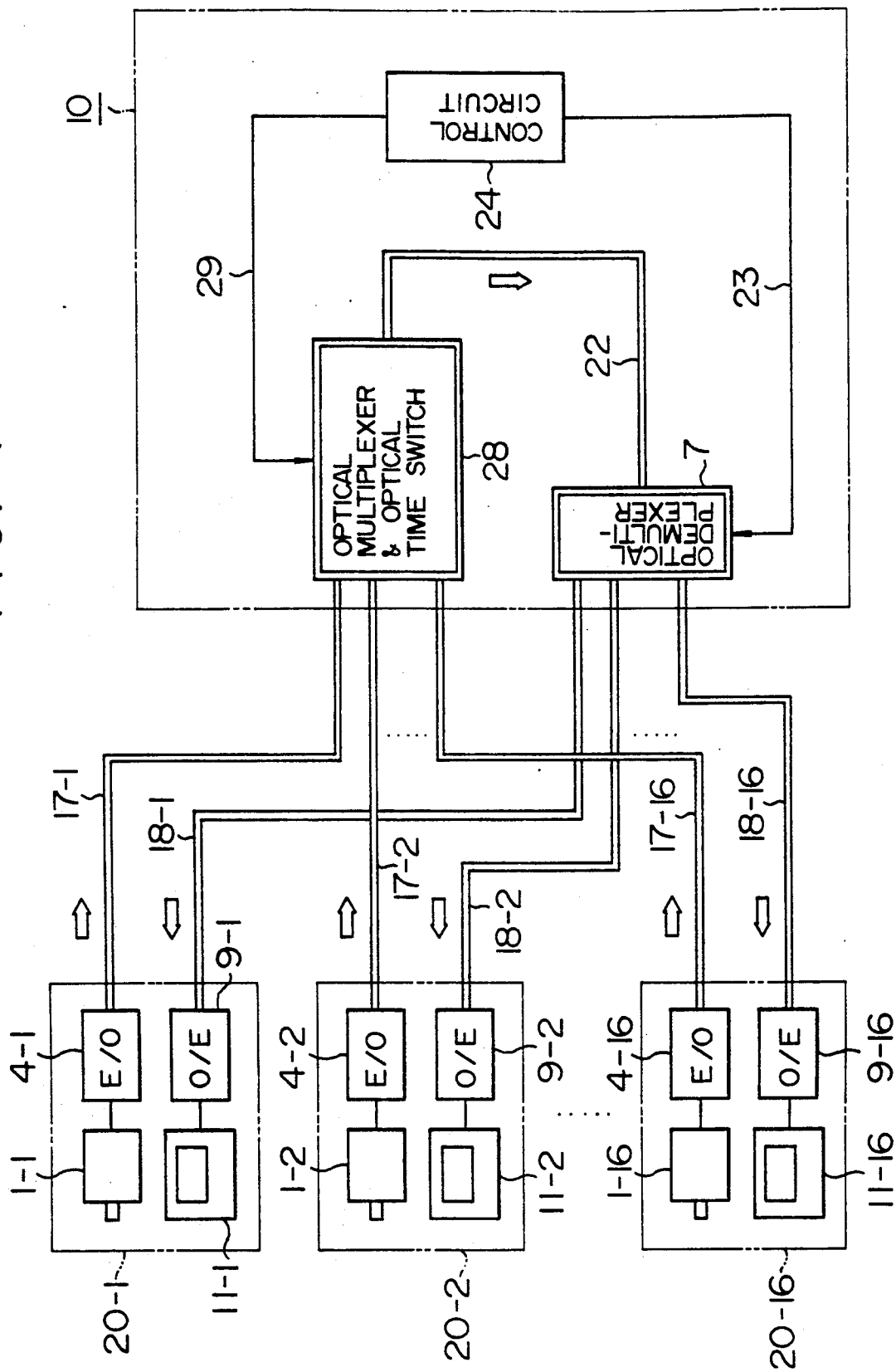

FIG. 4 shows a constitution of another embodiment of an optical switching system according to the invention. This embodiment relates to the example in which the optical multiplexer 5 and optical time switch 21 in FIG. 3 are constituted by an integrated optical apparatus 28. Namely, in the optical apparatus 28, the parallel optical signals from the subscribers are time division multiplexed and the multiplexed optical signals are sequentially stored into the optical memory every line. When the optical signals stored in the optical memory are read out, their time orders are replaced in such a manner that they are rearranged at desired time positions and read out. In this way, the time division multiplex and signal exchange are executed in the same apparatus. An example of the practical constitution of the optical apparatus (optical multiplexer and optical time switch) 28 will be explained hereinafter.

An example of the practical constitutions of the optical multiplexer 5, optical time switch 21, and optical demultiplexer 7 mentioned in the foregoing embodiment will now be described hereinbelow.

Figure 5:
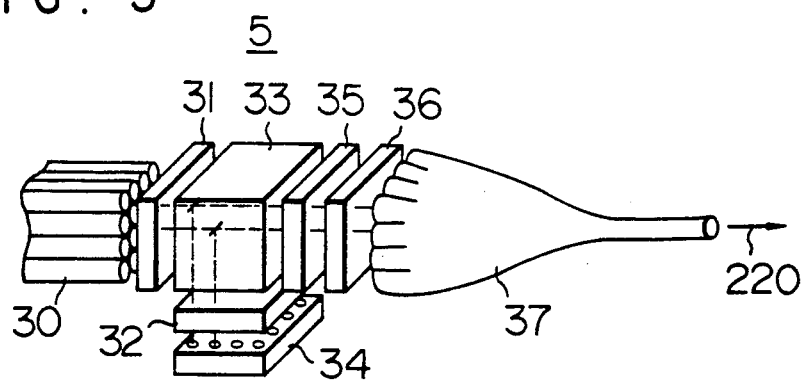
FIG. 5 is a perspective view of an embodiment of an optical multiplexer which is used in the optical switching system of the invention.
Figure 6:
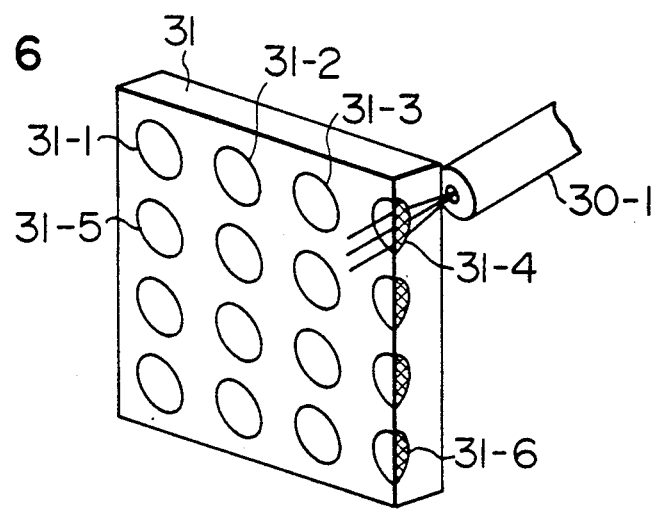
FIG. 6 is a perspective view of a planer micro-lens array which is used in the optical multiplexer in FIG. 5.

FIG. 5 shows a practical embodiment of the optical multiplexer 5 which is used in the invention. In the diagram, reference numeral 30 denotes a bundle of fiber optic cables constituted by arranging sixteen fiber optic cables in a matrix form of four columns and four rows. Numerals 31, 32, and 36 denote planer, graded index micro-lens arrays each for converting the lights emitted from the sixteen fiber optic cables into the parallel lights. Each of these lens arrays has such a structure as shown in FIG. 6 and has already been well known. Although only one optical fiber 30-1 is shown in FIG. 6 for simplicity of explanation, each of micro lenses 31-1 to 31-16 corresponds to each of the optical fibers of the fiber optic cable bundle 30.

Figure 7:
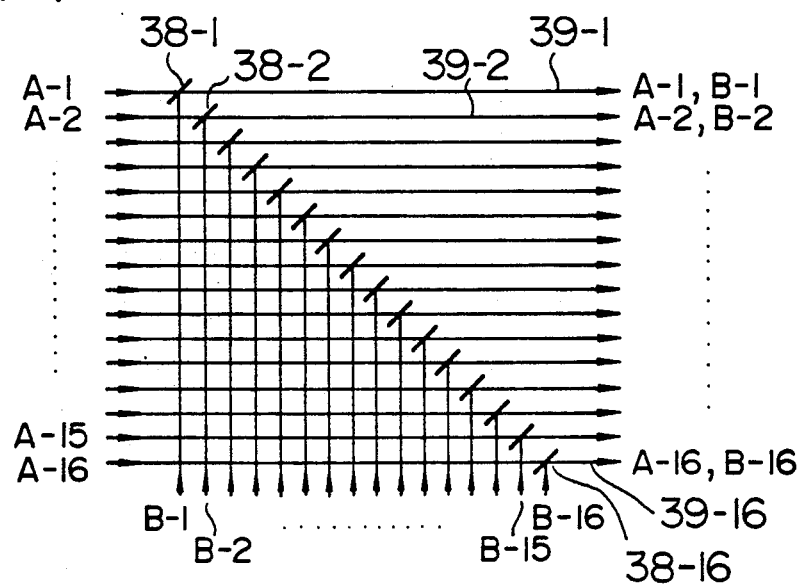
FIG. 7 is a principle explanatory diagram of a matrix type beam splitter which is used in the optical multiplexer in FIG. 5.

Numeral 33 denotes a matrix type beam splitter and its principle diagram is shown in FIG. 7. As shown in FIG. 7, the optical signals A-1 to A-16 which entered from the row side and the optical signals B-1 to B-16 which entered from the column side are merged by beam splitters 38-1 to 38-16, respectively. For example, when attention is paid to the beam splitter 38-1, the transmitted optical signal of the optical signal A-1 and the reflected optical signal of the optical signal B-1 are merged, thereby obtaining a merged optical signal 39-1. Similarly, merged optical signals 39-2 to 39-16 are derived.

Figure 8:
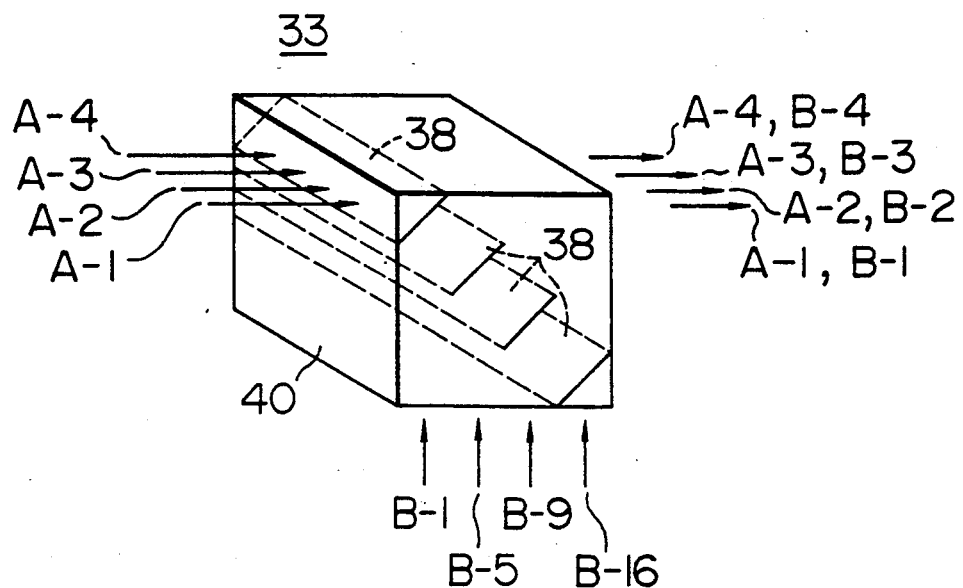
FIG. 8 is a diagram showing a constitution of an embodiment of the matrix type beam splitter which is used in the optical multiplexer in FIG. 5.

FIG. 8 shows a schematic diagram of a constitution of the matrix type beam splitter 33 which has such a structure that four half mirrors 38 are inserted into a glass block 40.

In FIG. 5, reference numeral 34 denotes a laser diode array for oscillating optical pulses for sampling. As the laser diode array 34, the array which has conventionally been known is used. For example, the array disclosed in the literature of Uchiyama and Iga, "GaInAsP/InP Two-Dimensional Array of Surface Emitting Laser Diode", Proceedings of Technical Conference, No. 932, IECE-J, 1985, may be used.

Figure 9:
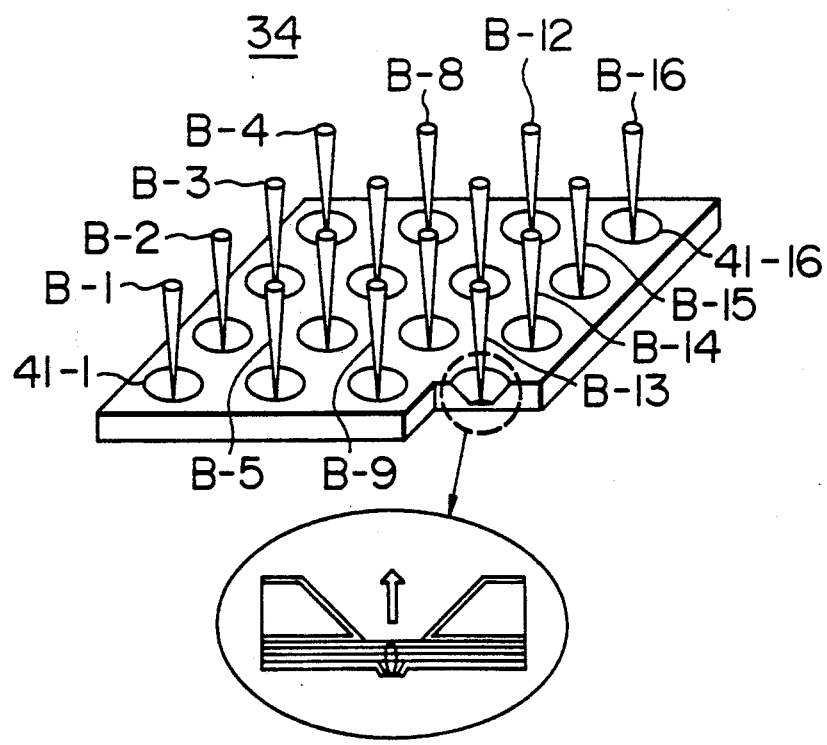
FIG. 9 is a perspective view showing a constitution of an embodiment of a laser diode array for generating optical pulses for sampling in FIG. 5.

FIG. 9 is a perspective view showing a constitution of an embodiment of the laser diode array 34 for generating the optical pulses for sampling. The laser diode array 34 is constituted by arranging sixteen surface emitting laser diodes 41-1 to 41-16 in a matrix form of four rows and four columns. As is well known in the electric communication field, there are the time division multiplexing methods such as bit interleave for multiplexing the signals of the respective channels into one frame every bit, word interleave for collectively multiplexing several bits of one channel, and the like. The case of the bit interleave is shown here for simplicity of explanation. Although the sync signals and the like are necessary in the frame, they are not essential in the explanation of the signal exchange of the invention; therefore, their descriptions are omitted. The surface emitting laser diodes 41-1 to 41-16 oscillate the sampling optical pulses which are sequentially deviated every time period of $\tau/16$ for the optical signal pulse width $\tau$ sent from the subscriber. If the order to make the sixteen surface emitting laser diodes emit the optical pulses at the timings which were sequentially deviated every time period of $\tau/16$ is controlled by a conversion control signal from the control circuit 24 in FIG. 3, the optical multiplexer and optical time switch can be integrally constituted as shown in FIG. 4 and the time division line switching can be performed.

In FIG. 5, numeral 35 denotes an optical AND gate array which is constituted by arranging sixteen optical AND gate devices in a matrix form of four rows and four columns. As the optical AND gate device, for example, it is possible to use the semiconductor differential gain device disclosed in the literature of S. D. Smith, et al, "Room Temperature, Visible Wavelength Optical Bistability In ZnSe Interference Filters", Optics Communications, Vol. 51, No. 5, P357.

Figure 10:
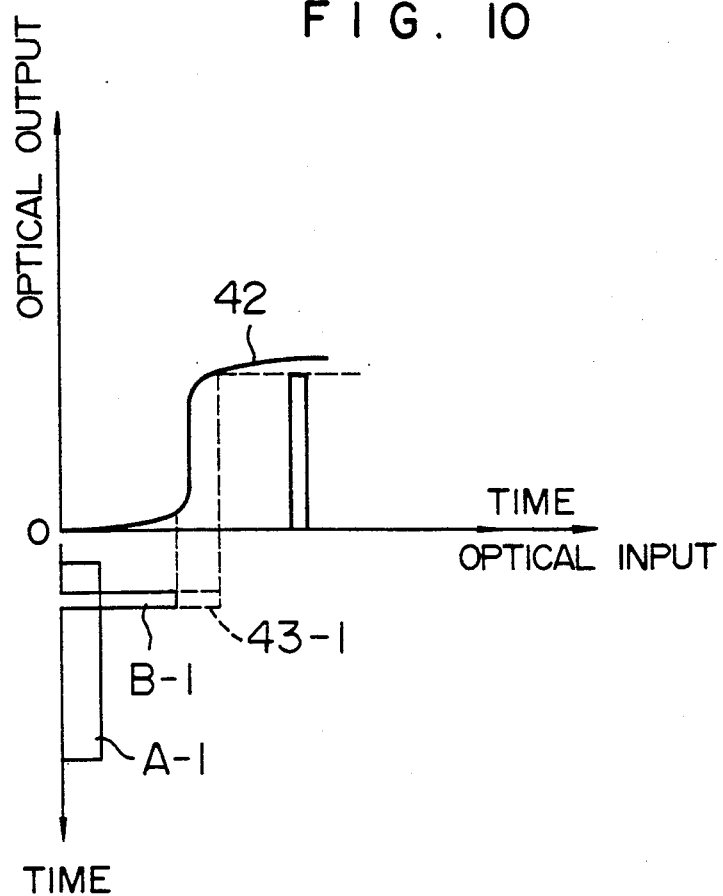
FIG. 10 is an input/output characteristic diagram of an optical AND gate element of an optical AND gate 35 in FIG. 5.

FIG. 10 is a input/output characteristic diagram of the optical AND gate array.

In the optical input/output characteristic as shown at numeral 42 in FIG. 10, the optical pulse amplitude of the light (for example, B-1) emitted from the surface emitting laser diode is set to a value which is slightly lower than the optical input level at which a nonlinear change of the input/output occurs and an optical level 43-1 merged with the optical signal (for example, A-1) transmitted from the subscriber is set to a value higher than the optical input level at which the foregoing nonlinear change occurs. By setting those levels in this manner, the output optical pulses are generated for only the period of time when the sampling optical pulses exist, so that the optical sampling can be performed.

Figure 11:
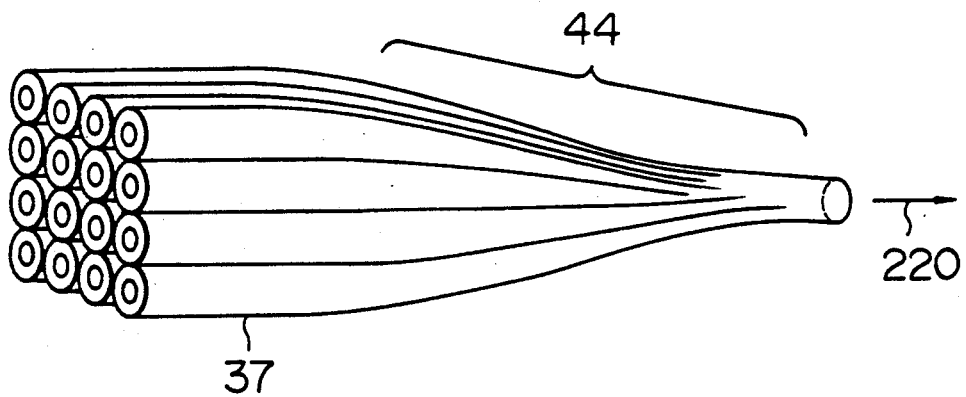
FIG. 11 is a perspective view of an embodiment of a fiber optic coupler, 37 in FIG. 5.

In FIG. 5, the planer, graded index micro-lens array 32 converts the laser emission lights from the laser diode array 34 into the parallel beams. The planer, graded index micro-lens array 36 converges the parallel beams into the optical fibers of a fiber coupler 37 with 16 fan-in and 1 fan-out. The fiber coupler 37 is constituted by arranging sixteen input side optical fibers in a matrix form of four rows and four columns as shown in FIG. 11. The output side of the fiber coupler 37 has a shape 44 which is twisted, tapered, fused, and elongated. The respective beams are merged on the output side and emitted in the direction of an arrow 220.

Figure 12:
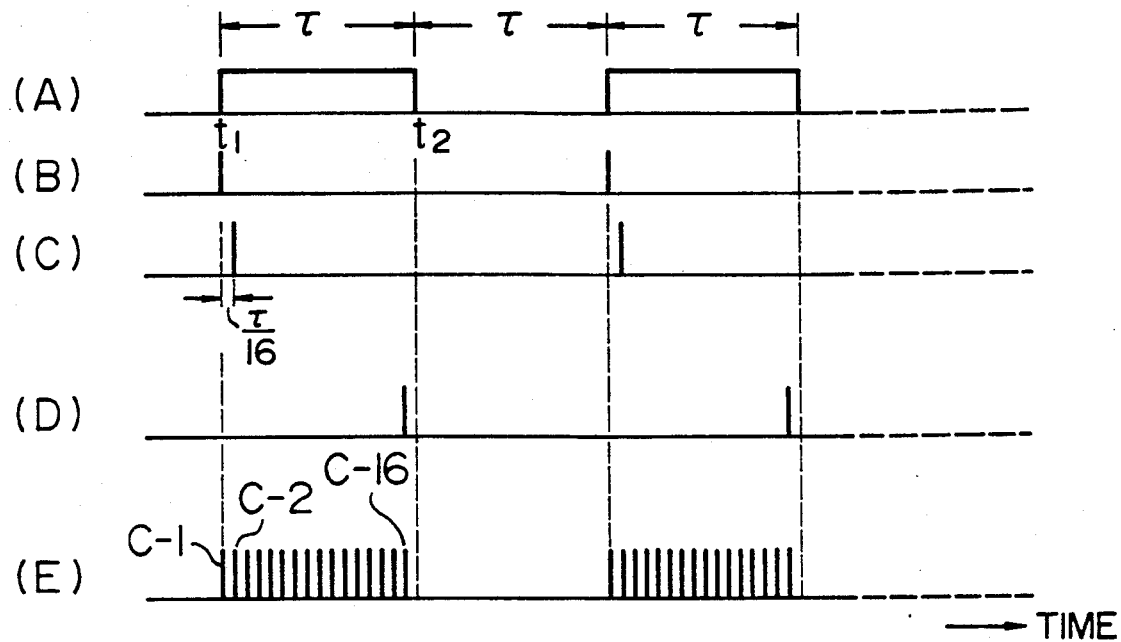
FIG. 12 is a time chart for explaining the operation of an embodiment of an optical multiplexer which is used in the invention.

The principle of the time division multiplex in the optical multiplexer 5 shown in FIG. 5 will now be described with reference to a time chart of FIG. 12. As an example, it is assumed that each of the optical signals A-1 to A-16 from the subscriber side has such a waveform as shown in FIG. 12A. On the other hand, the sampling optical pulses B-1 to B-16 of the laser diode array 34 are oscillated at the timings which are sequentially deviated by every time period of $\tau/16$ as shown in FIGS. 12B to 12D. The merged signals of A-1 and B-1, A-2 and B-2, ..., and A-16 and B-16 are input to the optical AND gate devices, respectively. Therefore, as shown in FIG. 12E, optical signals C-1 to C-16 which are sequentially deviated at every time period of $\tau/16$ are output from the optical AND gate devices. These optical signals are input to the fiber coupler 37 and the time division multiplexed optical signal is obtained on the output side of the fiber coupler 37 as shown in FIG. 12E. This optical signal is transmitted in the direction of the arrow 220 (FIG. 11) and input to the optical time switch 21 (FIG. 3) at the next stage. The optical time switch may be constituted as shown in, e.g., FIG. 2. On the other hand, as previously mentioned, if the surface emitting laser diodes in the laser diode array are operated so as to emit the optical pulses under a desired converting condition, i.e., in accordance with a desired time sequence, the time sequential optical signal from the fiber coupler 37 becomes the signal which has already been time division converted. Therefore, the constitution shown in FIG. 4 can be realized.

Figure 13:
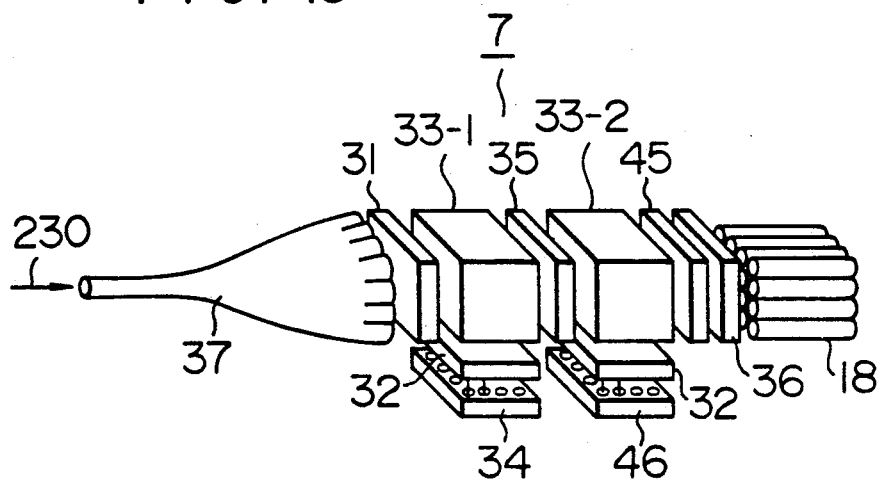
FIG. 13 is a perspective view showing a constitution of an embodiment of an optical demultiplexer which is used in the invention.
Figure 14:
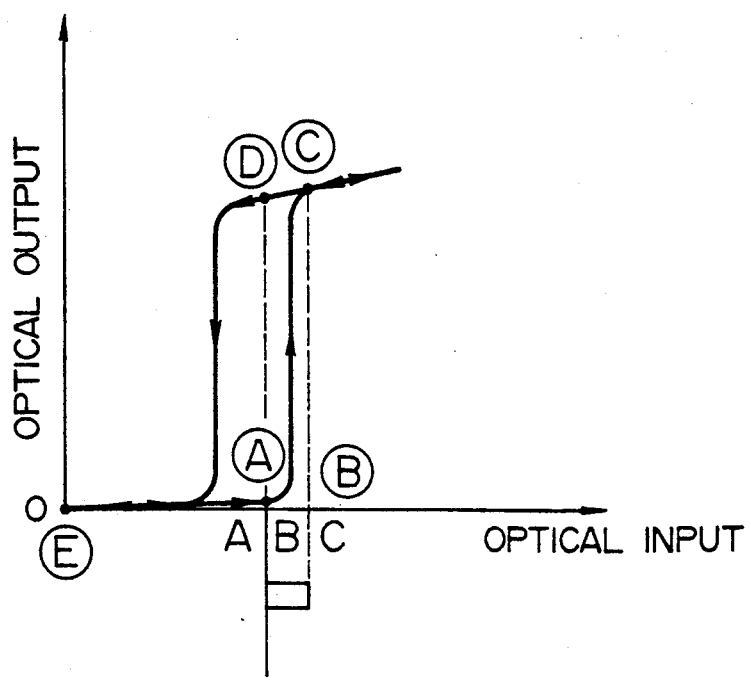
FIG. 14 is an input/output characteristic diagram of an optical device which is used in the optical demultiplexer.

The constitution of the optical device of the optical demultiplexer 7 in FIG. 3 will now be described. FIG. 13 shows a constitution of an embodiment of the optical demultiplexer 7 which is used in the invention. In FIG. 13, the parts and components having the same functions as those shown in FIG. 5 are designated by the same reference numerals. In the diagram, a laser diode array 46 is similar to the laser diode array 34 and generates such holding pulses as shown in a time chart of FIG. 15D. The laser diode array 46 is synchronized with the laser diode array 34. Numeral 45 denotes a bistable semiconductor device array. By changing the use condition of the semiconductor differential gain device shown in the literature of S. D. Smith, et al as previously mentioned, the semiconductor device array 45 can be obtained. FIG. 14 shows an input/output characteristic of the bistable semiconductor device array 45. The optical output has the hysteresis characteristic to the optical input signal.

Figure 15:
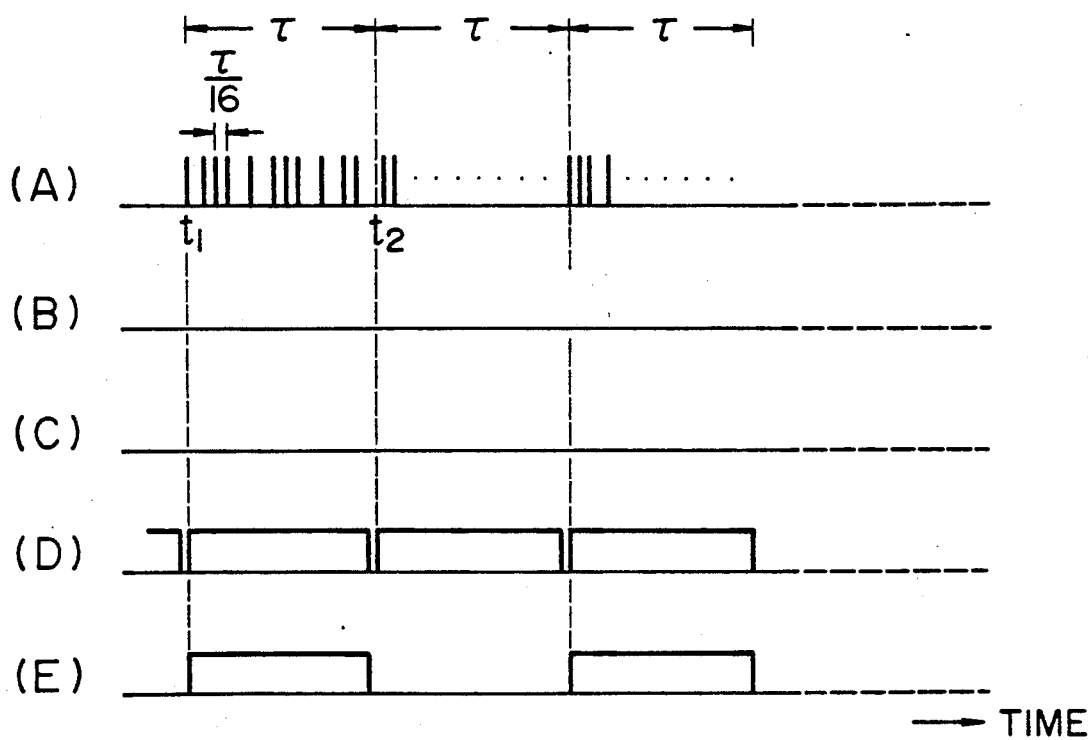
FIG. 15 is a time chart for explaining the operation of the optical demultiplexer.

The operation of the optical demultiplexer 7 shown in FIG. 13 will now be desribed with reference to a time chart of FIG. 15. In FIG. 13, an output optical signal 230 from the optical time switch 21 is input to the fiber coupler 37. The optical signal is divided into sixteen signals and output to the emission ends of sixteen optical fibers arranged in a matrix form of four rows and four columns in the fiber coupler 37. The divided signals enter the micro-lens array 32. The optical signals which entered the micro-lens array 32 are converted into the parallel beams and transmitted to the matrix type beam splitter 33-1. The optical signals of the laser diode array 34 for oscillating the sampling optical pulses are merged with those parallel beams by the beam splitter 33-1. The merged signals are input to the optical AND gate array 35. In the foregoing optical signal system, the time sequential signal from each emitting fiber of the fiber coupler 37 is as shown in, e.g., FIG. 15A. The signals of sixteen channels are multiplexed in one frame of the time width τ every bit. FIG. 15B shows a waveform of the sampling optical pulse from one laser diode of the laser diode array 34. Similarly to the case of the optical multiplier 5 previously mentioned, such a waveform that the signal of one channel was extracted from the time division multiplexed signal as shown in FIG. 15C is derived by the operation of the optical AND gate array. Such an operation is executed for the output light of each output fiber of the fiber coupler 37. The time division multiplexed signal is converted into sixteen spatially divided channel signals. The optical output signal from the optical AND gate array 35 is input to a second matrix type beam splitter 33-2 and merged with the holding pulses (FIG. 15D) from the laser diode array 46. The merged signals are input to the bistable semiconductor device array 45. Each device of the array 45 has the optical input/output characteristic as shown in FIG. 14 mentioned above. Therefore, the amplitude of holding pulse is set to a value of Ⓐ in FIG. 14 on the input side of each bistable device of the bistable semiconductor device array 45. The sum of the amplitude of the holding pulse and the amplitude of the signal pulse of each channel is set to a value higher than the level of Ⓑ on the output side of the bistable device. By setting those amplitudes in this manner, when pulse is input, the output of the bistable device changes along the locus of Ⓔ→Ⓐ→Ⓔ even if the holding pulse exists. However, when a pulse is input, the output of the bistable device changes along the locus of Ⓔ→Ⓐ→Ⓒ→Ⓓ and even if the input pulse is extinguished, the optical output can be derived so long as the holding pulse exists. Therefore, by providing such a reset portion as shown in FIG. 15D at the end of the holding pulse, the optical signal having the pulse width before the time division multiplex as shown in FIG. 15E is derived as the output of each bistable device of the bistable semiconductor device array 45 and the optical multiplex and demultiplex are performed. The optical signals are converged by the micro-lens array 36 and input to one optical fiber in the fiber optic cable bundle 18 and sent to the subscriber side.

Although the foregoing embodiments have been described with respect to the case of the optical switching system between the subscribers and the local switch, the present invention is not limited to only these embodiments. For example, the invention can be also applied to the case of the optical switching system in which the communication is performed from one local switch to another local switch or from the local switch to the toll switch. On the other hand, the number of subscribers is not limited to sixteen but may be set to an arbitrary number. Further, the transmission data which has conventionally been considered can be also used as the transmission data from the subscriber side. In addition, although the single sign NRZ code has been shown in the foregoing embodiments, another code such as, e.g., single sign RZ code may be also used. An array of light emitting diodes may be also used in place of the laser diode array 34.

According to the invention, all of the time division multiplex and demultiplex of the signals are performed by the optical signals without converting the optical signals into the electric signals. All of the signal paths for performing the line switching are also executed by the optical signals. Therefore, the high speed and broad band information can be handled. On the other hand, the signal processes are executed by the optical signals, so that the S/N ratio can be remarkably improved and the reduction in size and cost can be also realized.

We claim:

1. An optical switching system comprising:
   a plurality of first and second fiber optical cable lines for connecting subscriber terminals and the optical switching system and for transmitting optical signals therebetween;
   an optical time division multiplexer having an optical sampling means for sampling separately one sample to every frame period for each of the optical signals which are transmitted in parallel from the plurality of first fiber optical cable lines to generate optical sample signals and a multiplexing means for multiplexing said optical sample signals obtained by said sampling means to obtain a time division multiplexed optical signal train in time slots;

an optical time switch including optical memory means to temporarily store said optical sample signals extracted from said time division multiplexed optical signal train and means for reading said optical sample signals stored in said memory means so as to interchange the order of the time slots in said time division multiplexed optical signal train and for outputting an interchanged multiplexed optical signal train having one sample for each of the optical signals;

an optical time division demultiplexer for demultiplexing said interchanged multiplexed optical signal train outputted from said optical time switch, for distributing the demultiplexed optical signals to the plurality of said second fiber optical cable lines, and for transmitting the distributed optical signals in parallel; and means including an electronic control circuit for performing time slot conversion control of said optical time division multiplexer, said optical time division demultiplexer and said optical time switch.

2. An optical switching system according to claim 1, wherein a portion of an optical path between said optical time division multiplexer and said optical time switch and between the optical time switch and said optical time division demultiplexer is coupled by a single fiber optic cable for transmitting said time division multiplexed optical signals.

3. An optical switching system comprising:

a plurality of first and second fiber optical cable lines for transmitting optical signals;

an optical time division multiplexer having an optical sampling means for sampling separately one sample to every frame period for each of the optical signals which are transmitted in parallel from the plurality of first fiber optic cable lines and a multiplexing means for multiplexing said optical sample signals obtained by said sampling means to obtain a time division multiplexed optical signal train in time slots, wherein said optical time division multiplexer includes;

a lens array for converting the output optical signals of said plurality of first fiber optic cable lines into collimated beams;

a light emitting device array having a plurality of light emitting devices each of which produces sporadically an output signal in the form of optical beams for optical sampling of one of said collimated beams;

a beam splitter for receiving the collimated beams from said lens array and the optical beams from said light emitting device array and for combining said beams;

a gate array having a plurality of optical AND gates provided in the paths of said plurality of combined beams from said beam splitter for producing optical outputs; and an optical coupler for combining the optical outputs of said gate array to couple with a single optical fiber, and for obtaining the time division multiplexed optical signal;

an optical time switch for interchanging the order of the time slots in said time division multiplexed signal train;

an optical time division demultiplexer for demultiplexing said interchanged multiplexed signal train outputted from said optical time switch, for distributing the demultiplexed optical signals to the plurality of said second fiber optic cable lines, and for transmitting the distributed optical signals in parallel; and means including an electronic control circuit to interchange the time slots for performing time slot conversion control of said optical time division multiplexer and said optical time switch.

4. An optical switching system according to claim 3, wherein said light emitting device array is constituted by arranging semiconductor laser devices in a matrix form.

5. An optical switching system according to claim 3, wherein said beam splitter is constituted by a plurality of half mirrors each of which is placed at crosspoints of the optical paths of a group of the collimated beams from said lens array and the optical paths of a group of optical beams from said light emitting device.

6. An optical switching system according to claim 3, wherein each of a plurality of optical AND gates of said gate array is a device for generating an optical output only when both of a collimated beam of said lens array and an optical beam of said light emitting device exist.

7. An optical switching method for transmitting optical signals received from a plurality of first fiber optic cable lines through a switching means to a plurality of second fiber optic cable lines comprising:

a first step of time division multiplexing which samples optically one sample to every frame period for each of said optical signals sent from said plurality of first fiber optic cable lines to generate optical sample signals and multiplexes said optical sample signals in time slots having an order to obtain a multiplexed optical signal train;

a second step of time division switching for interchanging the order of the time slots in said multiplexed optical signal train by temporarily and optically storing said optical sample signals extracted from said train division multiplexed optical signal train and by reading out said stored optical sample signals in accordance with a desired order so as to interchange the order of the time slots in said multiplexed optical signal train and to output an interchanged multiplexed optical signal train;

a third step of demultiplexing said interchanged multiplexed optical signal train which is derived in said second step; and a fourth step of outputting said optical signals which are demultiplexed in said third step to said plurality of second fiber optic cable lines and transmitting said optical signals in parallel.

8. An optical switching system comprising:

a plurality of first and second fiber optical cable lines for transmitting optical signals;

an optical time division multiplexer having an optical sampling means for sampling separately one sample to every frame period for each of the optical signals which are transmitted in parallel from the plurality of first fiber optic cable lines and a multiplexing means for multiplexing said optical sample signals obtained by said sampling means to obtain a time division multiplexed optical signal train in time slots;

an optical time switch for interchanging the order of the time slots in said time division multiplexed signal train;

an optical time division demultiplexer for demultiplexing said interchanged multiplexed signal train outputted from said optical time switch, for distributing the demultiplexed optical signals to the plurality of said second fiber optic cable lines, and for transmitting the distributed optical signals in parallel;

means including an electronic control circuit to interchange the time slots for performing time slot conversion control of said optical time division multiplexer and said optical time switch;

wherein said optical time division multiplexer and said optical time switch are integrally constituted so as to include;

a lens array for converting the optical signals from said plurality of first fiber optic cable lines into collimated beams;

a light emitting device array having a plurality of light emitting devices, said light emitting devices being arranged to correspond to said collimated beams, and the light emitting time of each of the light emitting devices being controlled by said electronic control circuit so that the light emitting device produces a sampling optical beam at selected time slot timing; and means for receiving the sampling optical beams from said light emitting device array and the collimated beams from said lens array for sequentially producing said time division multiplexed optical signal train.

9. An optical switching system comprising:

a plurality of first and second fiber optical cable lines for transmitting optical signals;

an optical time division multiplexer having an optical sampling means for sampling separately one sample to every frame period for each of the optical signals which are transmitted in parallel from the plurality of first fiber optic cable lines and a multiplexing means for multiplexing said optical sample signals obtained by said sampling means to obtain a time division multiplexed optical signal train in time slots;

an optical time switch for interchanging the order of the time slots in said time division multiplexed signal train;

an optical time division demultiplexer for demultiplexing said interchanged multiplexed signal train outputted from said optical time switch, for distributing the demultiplexed optical signals to the plurality of said second fiber optic cable lines, and for transmitting the distributed optical signals in parallel, wherein said optical time division demultiplexer comprises:

a fiber optic coupler for distributing optical signals from said optical time switch into a plurality of optical beams;

a first light emitting device array for generating a plurality of sampling optical pulses corresponding to the optical beams from said fiber optic coupler respectively;

a first beam splitter for outputting optical beams obtained by combining the output optical beams of said fiber optic coupler and the plurality of optical pulses from said first light emitting device array;

a first gate array comprising a plurality of optical devices arranged in a path of a plurality of output beams of said first beam splitter for outputting demultiplexed optical signals;

a second light emitting device array for generating a plurality of holding pulses;

a second beam splitter for outputting optical beams obtained by combining the optical signal from said first gate array and the holding pulses from said second light emitting device array; and a bistable device array including a plurality of bistable optical devices arranged in correspondence to a plurality of beam paths of the optical beams outputted from said second beam splitter for expanding said demultiplexed optical signals; and means including an electronic control circuit to interchange the time slots for performing time slot conversion control of said optical time division multiplexer and said optical time switch.

* * * * *